(12) United States Patent
Sato

(10) Patent No.: US 11,104,136 B2
(45) Date of Patent: Aug. 31, 2021

(54) METHOD FOR PRODUCING FILM AND LIQUID EJECTION HEAD

(71) Applicant: CANON KABUSHIKI KAISHA, Tokyo (JP)

(72) Inventor: Masanori Sato, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 312 days.

(21) Appl. No.: 16/199,664

(22) Filed: Nov. 26, 2018

(65) Prior Publication Data

US 2019/0184707 A1  Jun. 20, 2019

(30) Foreign Application Priority Data

Dec. 15, 2017  (JP) .............................. JP2017-240794

(51) Int. Cl.

| B41J 2/16 | (2006.01) |
|---|---|
| H01L 41/35 | (2013.01) |
| H01L 41/27 | (2013.01) |
| B41J 2/14 | (2006.01) |
| B41J 2/045 | (2006.01) |
| H01L 41/09 | (2006.01) |
| H01L 41/318 | (2013.01) |
| H01L 41/08 | (2006.01) |

(52) U.S. Cl.

CPC ......... *B41J 2/1632* (2013.01); *B41J 2/04581* (2013.01); *B41J 2/14233* (2013.01); *B41J 2/161* (2013.01); *B41J 2/1612* (2013.01); *B41J 2/1623* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *H01L 41/0815* (2013.01); *H01L 41/0973* (2013.01); *H01L 41/318* (2013.01); *B41J 2002/14258* (2013.01)

(58) Field of Classification Search
CPC .... B41J 2/1632; B41J 2/1612; B41J 2/14233; B41J 2/04581; B41J 2/1645; B41J 2/1626; B41J 2/1629; B41J 2/1646; B41J 2/1628; B41J 41/0973; B41J 41/318; H01L 41/0815; H01L 41/297; H01L 41/45; H01L 41/35; H01L 41/27; H01L 41/273
USPC ......... 29/25.35, 890.1, 890.09; 427/100, 444
See application file for complete search history.

(56) References Cited

U.S. PATENT DOCUMENTS

| 2012/0100330 A1 | 4/2012 | Soyama et al. |
| 2012/0171364 A1* | 7/2012 | Haider .............. H01L 21/02192 427/100 |
| 2015/0129547 A1 | 5/2015 | Soyama et al. |

FOREIGN PATENT DOCUMENTS

JP  2011-14649 A  1/2011

* cited by examiner

*Primary Examiner* — Peter Dungba Vo
*Assistant Examiner* — Kaying Kue
(74) *Attorney, Agent, or Firm* — Venable LLP

(57) ABSTRACT

A method of producing a film including repeating a cycle comprised of an application step, a coat removal step and a sintering step N times (N≥2), wherein relative to a liquid supply position in the (n)th (1≤n≤N−1) cycle coat removal step, a liquid supply position in the (n+1)th cycle coat removal step is the same or shifted in a direction approaching the center of a substrate for all n(s) and at the same time, shifted in a direction approaching the center of the substrate for at least one of the (n)s; or is the same or shifted in a direction away from the center of the substrate for all n(s) and at the same time, shifted in a direction away from the center of the substrate for at least one of the (n)s.

6 Claims, 10 Drawing Sheets

S1

S2

METHOD FOR PRODUCING FILM AND LIQUID EJECTION HEAD

BACKGROUND OF THE INVENTION

Field of the Invention

The present invention relates to a method of producing a film. The invention also relates to a method of producing a liquid ejection head.

Description of the Related Art

A ferroelectric film is formed, for example, by a sol-gel method and this method includes a step of applying, as a raw material solution, a coating solution containing an organic metal compound onto a substrate such as silicon wafer and a step of sintering and thereby crystallizing the resulting coating film. A typical example of a method of applying a coating solution onto a substrate is spin coating. In order to prevent occurrence of cracks in a film in a region of the peripheral edge portion of the substrate, the application step and the sintering step have therebetween a coat removal step called "edge bead removal (EBR)". In this step, a liquid is added to the coating film in the region to remove the coating film from the region.

Japanese Patent Application Laid-Open No. 2011-14649 discloses repetition of a cycle including an application step, an EBR step, and a sintering step in a plurality of times in order to obtain a ferroelectric film or piezoelectric film having a desired thickness.

When a piezoelectric film having a film thickness of several μm or more is formed by the method disclosed by Japanese Patent Application Laid-Open No. 2011-14649, however, the film thus obtained sometimes has many cracks in the vicinity of its film end portion formed by EBR. These cracks may be a cause of film exfoliation or a source of particles, resulting in deterioration in production yield.

SUMMARY OF THE INVENTION

An object of the invention is to provide a film production method suited for production of a piezoelectric film having a thickness of several μm or more and capable of suppressing generation of cracks in the vicinity of the film end portion.

The other object of the invention is to provide a method of producing a liquid ejection head equipped with a piezoelectric film in a high yield.

In one aspect of the invention, there is provided a method of producing a film by repeating a cycle comprised of:

a step of applying a coating solution onto a substrate to form a coating film, a step of removing the coating film in a region on a peripheral edge portion of the substrate by supplying the coating film with a liquid while rotating the substrate and a step of carrying out sintering treatment to crystallize a portion of the coating film that has remained after removal of the coating film from the region N times (N representing an integer of 2 or more), wherein supposing that n represents an integer of 1 or more to N−1 or less, relative to a supply position of the liquid to the coating film in the (n)th cycle coat removal step, a supply position of the liquid to the coating film in the (n+1)th cycle coat removal step is the same or shifted in a direction approaching the center of the substrate for all n(s) and at the same time, shifted in a direction approaching the center of the substrate for at least one of the n(s); or relative to a supply position of the liquid to the coating film in the (n)th cycle coat removal step, a supply position of the liquid to the coating film in the (n+1)th cycle coat removal step is the same or shifted in a direction away from the center of the substrate for all n(s) and at the same time, shifted in a direction away from the center of the substrate for at least one of the n(s).

In the other aspect, there is also provided a method of producing a liquid ejection head equipped with a piezoelectric film, including producing the piezoelectric film by the film production method provided above.

Further features of the present invention will become apparent from the following description of exemplary embodiments with reference to the attached drawings.

BRIEF DESCRIPTION OF THE DRAWINGS

FIGS. 2A, 2B and 2C are schematic views for describing spin coating, in which FIGS. 2A and 2B show an application step and FIG. 2C shows a coat removal step.

FIGS. 7A and 7B are schematic views for describing application of a film shrinkage stress on the PZT film, in which FIG. 7A shows that in Referential Example 1 and FIG. 7B shows that in Comparative Example 1.

DESCRIPTION OF THE EMBODIMENTS

Figure 1:
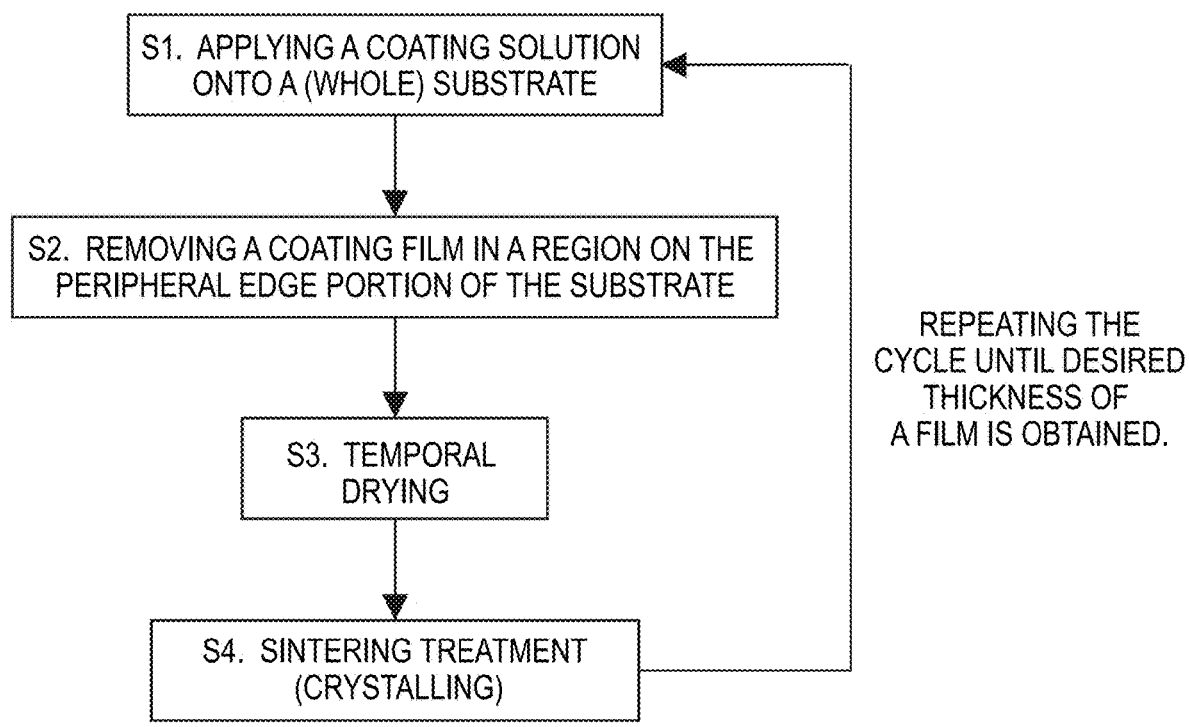
FIG. 1 shows one embodiment of a film production method using the sol-gel method.

FIG. 1 shows one embodiment of a film production method using the sol-gel method with spin coating which method is suited for the formation of a ferroelectric film, particularly, a piezoelectric film. This film production method has the following steps S1, S2, S3 and S4 in order of mention.

S1: a step of applying a coating solution onto a substrate to form a coating film.

S2: a step of supplying the coating film with a liquid (which may hereinafter be called "coat removal liquid") while rotating the substrate, thereby removing a portion of the coating film in a region on the peripheral edge portion of the substrate.

S3: a drying step for removing an organic component from the coating film that has remained after removal of the portion of the coating film from the region.

S4: a step of carrying out sintering treatment to crystallize the coating film that has remained after removal of the portion of the coating film from the region.

With steps S1 to S4 as one cycle, a film is formed by repeating this cycle N times (N represents an integer of 2 or more). This makes it possible to form a film having a desired thickness, for example, a piezoelectric film having a preferable thickness of several μm or more.

Figure 2A:
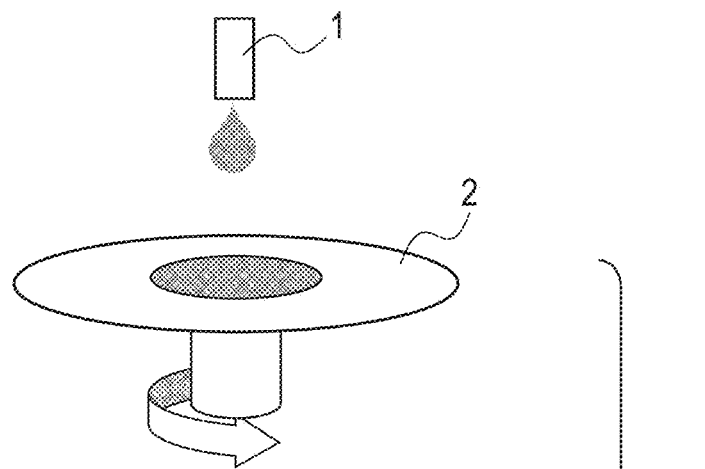
Figure 2B:
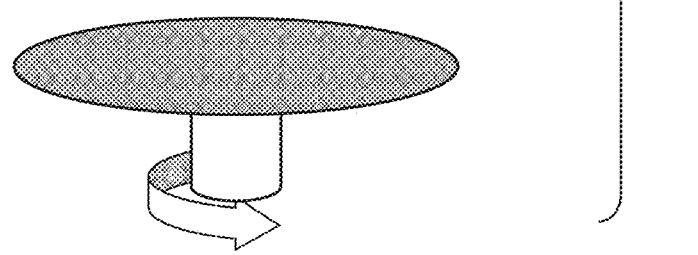
Figure 2C:
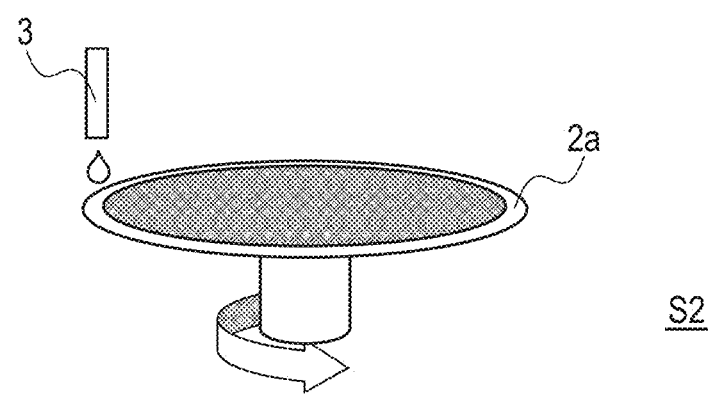

A coating solution can be applied to a substrate by spin coating shown in FIGS. 2A to 2C. More specifically, in Step S1, while rotating a substrate 2 at a predetermined rotational speed, a coating solution is added dropwise onto the substrate 2 from a coating solution ejection orifice 1 and is spread over the whole surface of the substrate. FIG. 2A shows a stage before the coating solution added dropwise spreads over the whole surface of the substrate and FIG. 2B shows a stage where the coating solution spreads over the whole surface of the substrate.

Then, as shown in FIG. 2C, in step S2, the coating film in a region on a peripheral edge portion 2a of the substrate is removed by supplying the coating film with a liquid while rotating the substrate at a predetermined rotational speed. At this time, a coat removal liquid is supplied (for example, jetted, added dropwise, or caused to flow downward) to the coating film from a coat removal liquid ejection orifice 3. The coat removal liquid thus supplied flows toward the peripheral side by centrifugal force and the coating film present on the peripheral side outside the coat removal liquid supply position is removed. The peripheral edge portion 2a of the substrate is a region from the peripheral end of the substrate to about 5 mm inside thereof in the radius direction.

Next, the coating film is dried in Step S3, if necessary. The substrate can be dried, for example, at about 300° C. to remove the organic component in the coating film.

Next, in Step S4, the coating film is crystallized, for example, at a temperature of 600° C. or more in an oxygen atmosphere.

A coating film obtained by single spin coating has a thickness of only about several hundred nm. Therefore, steps including Steps S1 to S4 are repeated N times (N representing an integer of 2 or more) until a film of a desired thickness is formed.

Here, crack generation mechanism in the vicinity of the end portion of a substrate when a conventional method is used for film formation will be described. In the conventional method, a coat removal liquid supply position (meaning the position of the coat removal liquid ejection orifice 3) in Step S2 is the same in any of the above-described film formation cycles.

In this case, an angle between the end surface of the film and the surface of the substrate becomes larger as the film formation cycle is repeated. In the sintering treatment, crystallization of a film is accompanied by generation of a film shrinkage stress. When the angle between the end surface of the film and the surface of the substrate is small, the film shrinkage stress is applied to the end surface of the film mainly in a film thickness direction so that the stress does not concentrate on a corner portion (corner portion 4 in FIG. 3 and the like described later) formed between the surface (main surface) of the film and the end surface of the film. On the other hand, when the angle between the end surface of the film and the surface of the substrate is large, the film shrinkage stress is applied to the end surface of the film mainly in a direction orthogonal to the film thickness direction. Then, the stress concentrates on the corner portion and causes cracks.

Japanese Patent Application Laid-Open No. 2011-14649 describes that a nozzle (coat removal liquid ejection orifice) is moved outward in a radius direction in the EBR step to facilitate the flow of a gel-state coating film at the peripheral edge portion. In the method described in such a document, however, the stress concentration occurs because the initial position of the nozzle is the same in the EBR step at each cycle.

Since cracks occur due to such a mechanism, the position of supplying the coat removal liquid to the coating film is changed in a direction toward the periphery from the center of the substrate, that is, in a radius direction between a certain cycle and a cycle subsequent thereto in the film production method of the invention.

Described specifically, either one of the following Condition 1 or Condition 2 is satisfied. In these conditions, n stands for an integer of 1 or more to N−1 or less; and a position of supplying a coating film with a coat removal liquid in the (n)th cycle coat removal step is called "(n)th coat removal liquid supply position" and a position of supplying a coating film with a coat removal liquid in the (n+1)th cycle coat removal step is called "(n+1)th coat removal liquid supply position".

Condition 1: relative to the (n)th coat removal liquid supply position, the (n+1)th coat removal liquid supply position is the same or is shifted in a direction approaching the center of the substrate for all (n)s and at the same time, shifted in a direction approaching the center of the substrate for at least one of the n(s).

Condition 2: relative to the (n)th coat removal liquid supply position, the (n+1)th coat removal liquid supply position is the same or is shifted in a direction away from the center of the substrate for all n(s) and at the same time, shifted in a direction away from the center of the substrate for at least one of the n(s).

Under such a condition, the angle between the end surface of the film and the surface of the substrate can be kept small. This makes it possible to prevent occurrence of cracks because even if a film having a thickness of several μm or more is formed by repeating the above-described cycle, the film shrinkage stress is always applied to the end surface of the film mainly in the film thickness direction and the stress concentration on the corner portion is relaxed.

Substrate

A substrate is typically disc-shaped one. As the substrate, usable is a silicon wafer which may have thereon an appropriate layer such as base layer or film-formation initial layer in advance.

Coating Liquid

As a coating liquid, a known coating liquid (sol) to be used for the formation of a ferroelectric film, particularly, a piezoelectric film by CSD which will be described later, in particular, the sol-gel method with spin coating. The coating liquid can therefore contain an organic metal compound. Examples of the organic metal compound include alkoxides or carboxylate salts of a metal. The coating liquid can also contain a solvent as needed. Further, in order to form a piezoelectric film having a perovskite structure, the organic metal compound preferably contains two or more elements selected from the group consisting of lead, titanium, zirconium, barium, calcium, niobium, tantalum, bismuth, potassium, iron, manganese, ruthenium, and strontium.

Application Method

An application step is performed not only by spin coating but also by an appropriate method, for example, spray coating or dip coating Coat Removal Liquid Shift width When relative to the (n)th coat removal liquid supply position, the (n+1)th coat removal liquid supply position is shifted (moved) in a direction approaching the center of the substrate or away from the center of the substrate, the shift width can be set at about 0.5 mm. The shift width corresponds to a distance, in a radius direction of the substrate, between the (n)th coat removal liquid supply position and the (n+1)th coat removal liquid supply position.

In the sintering step, a calcining step can be followed by a crystallization annealing step. The calcining step is a step of hydrolyzing or thermally decomposing the organic metal compound in the coating film to convert it into a corresponding metal oxide. The crystallization annealing step is a step of enhancing crystallinity of the metal oxide obtained by the calcining step. The sintering step is however not required to be divided into the calcining step and crystallization annealing step.

Film

The invention is suited for the formation of a ferroelectric film, particularly, a piezoelectric film, particularly preferably a piezoelectric film having a perovskite structure. The invention is however not limited to it, but can be used for the formation of a ceramic film such as a metal oxide film.

A film having a thickness of 2 µm or more can be produced suitably by repeating the above-described cycle.

The invention can be used for a method of forming a film by repeating an application step, a coat removal (EBR) step and a sintering step and it can be used suitably for film production by chemical solution deposition (CSD). In the CSD method, a solution of a precursor substance of a film is applied to a substrate to form a coating film thereon, followed by sintering treatment. The precursor substance is typically an organic metal compound or hydrolysate thereof. In particular, a method making use of hydrolysis of an organic metal compound to form a gel-like coating film is called "gel-sol method", while a method not hydrolyzing an organic metal compound is called "MOD (Metal-Organic Decomposition) method".

Liquid Ejection Head

The invention also relates to a method of producing a liquid ejection head equipped with a piezoelectric film. In this method, the piezoelectric film is formed by the above-described film production method.

Figure 10A:
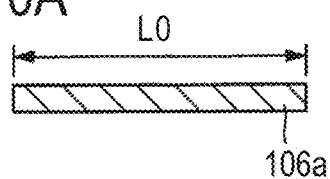
FIGS. 10A, 10B, 10C, 10D, 10E, 10F, 10G, 10H, 10I, 10J, 10K, 10L and 10M are cross-sectional schematic views for describing one example of a method of producing a liquid ejection head.

The following is one example of a method of producing a liquid ejection head using the PZT film obtained by the above-described production method. A glass vibration plate material 106a having a length L0 is prepared as shown in FIG. 10A. As the glass vibration plate material 106a, an anodic bonding glass is used. The anodic bonding glass is selected as needed from those capable of being anodically bonded and having a softening point sufficiently higher than the heating temperature in a direct formation step of a piezoelectric element 107 which will be conducted later. In the present example, "SD2 glass", trade name; product of HOYA Candeo Optronics is used as the anodic bonding glass. A crystallized glass "Devitron Hα-43", trade name; product of Ishizuka Glass can be given as another preferable example. The glass vibration plate material 106a usable here has a square shape with one side of 50.00 mm and a thickness of 50.00 µm.

Figure 10B:
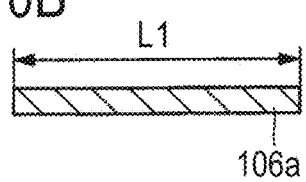

Then, as shown in FIG. 10B, a first heating step for causing preliminary shrinkage of the glass vibration plate material 106a is performed. The first heating step is performed in the air atmosphere by using an electric furnace while setting the maximum heating temperature at 650° C. and heating time at 5 hours. Then, the temperature is reduced to room temperature. In this drawing, L1 is a length of one side of the glass vibration plate material 106a measured using a laser length measuring machine in a thermostatic chamber of 25° C. after the first heating step. In the present example, L1 is 49.90 mm. This means that the first heating step causes 0.2% preliminary shrinkage in the length of one side of the glass vibration plate material 106a.

Figure 10C:
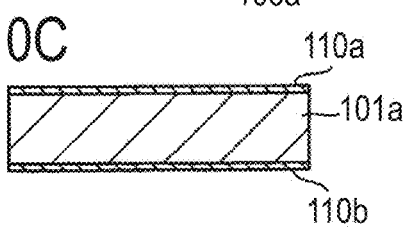

Then, as shown in FIG. 10C, a 300-nm thick silicon nitride film is deposited by LP-CVD on both surfaces of a double-side polished silicon single crystal substrate 101a having a plane orientation (100) to form first and second mask layers 110a and 110b.

Figure 10D:
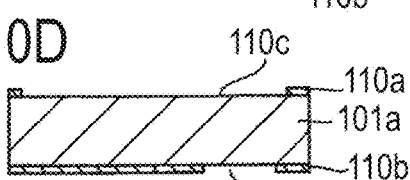
Figure 10E:
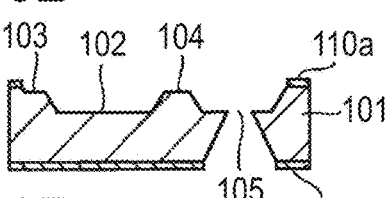

Then, as shown in FIG. 10D, the resulting substrate is processed by photolithography and dry etching with a CF4-containing gas to form a first mask opening 110c in the first mask layer 110a and a second mask opening 110d in the second mask layer 110b. Then, as shown in FIG. 10E, the silicon single crystal substrate 101a is anisotropically etched with a TMAH solution from the first mask opening 110c to form a pressure generating chamber 102, a nozzle 103, and an orifice 104. Similarly, the substrate is anisotropically etched from the second mask opening 110d to form a liquid supply chamber 105 communicated with the pressure generating chamber 102 through the orifice 104.

Figure 10F:
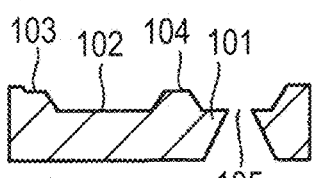
Figure 10G:
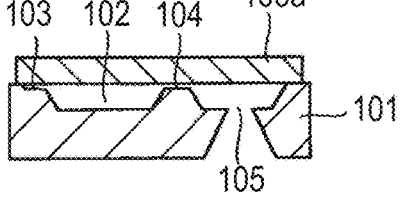

Then, as shown in FIG. 10F, by exposing the silicon surface by etching and removing the first and second mask layers 110a and 110b, a channel substrate 101 is formed. Then, as shown in FIG. 10G, the glass vibration plate material 106a obtained by the first heating step is anodically bonded to the channel plate 101. The glass vibration plate material 106a is bonded to the surface of the channel substrate 101 corresponding to the pressure generating chamber 102 to cover an etched trench comprised of the pressure generating chamber 102, the nozzle 103, the orifice 104 and the like. In the anodic bonding step of the present example, the bonding surface of the channel substrate 101 and the bonding surface of the glass vibration plate material 106a are cleansed and then overlapped with each other. After heating to 350° C., a voltage of 200V is applied between the glass vibration plate material 106a and the channel substrate 101 while using the channel substrate 101 as an anode and they are further pressed against each other.

Figure 10H:
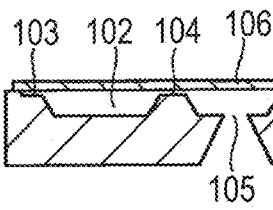

Then, as shown in FIG. 10H, the glass vibration plate material 106a bonded to the channel substrate 101 is polished into a thickness of 5 µm to form a vibration plate 106. This thinning processing is achieved by polishing with a lapping machine and an abrasive in order to remove unevenness or waviness and planarize the plate.

Figure 10I:
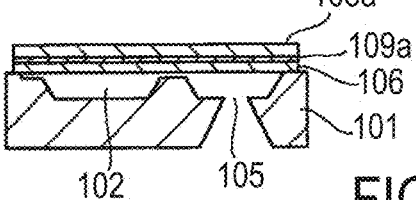

Then, as shown in FIG. 10I, a lower electrode 109a and a piezoelectric precursor layer 108a are formed and stacked on the vibration plate 106. The lower electrode 109a is a film stack obtained by depositing 20-nm thick Ti and 150-nm thick Pt by successive sputtering. The piezoelectric precursor layer 108a is a PZT (lead zirconate titanate) precursor thin-film formed by spin coating (application step).

Figure 10J:
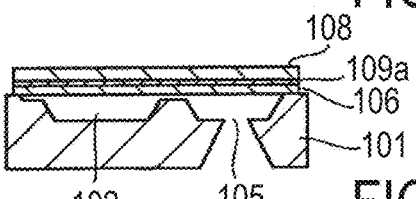

Then, as shown in FIG. 10J, a second heating step (sintering step) is performed to crystallize the piezoelectric precursor layer 108a. The second heating step is performed using an electric furnace in an oxidizing atmosphere while setting the maximum heating temperature at 650° C. and heating time at 5 hours. Then, the temperature is reduced to room temperature. In such a manner, the piezoelectric precursor layer 108a is crystallized to form a piezoelectric layer (piezoelectric film) 108. Evaluation by X-ray diffraction method has revealed that the piezoelectric layer 108 after the second heating step is a PZT thin-film having good crystallinity.

The application step shown in FIG. 10I and the sintering step shown in FIG. 10J however have therebetween the coat removal step by the above-described method. The application step, the coat removal step and the sintering step are repeated until the PZT film has a predetermined thickness (for example, 3 μm).

Figure 10K:
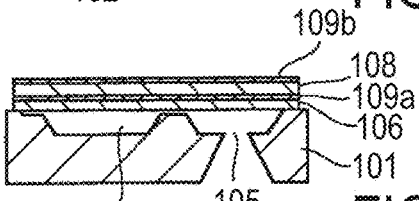

Then, as shown in FIG. 10K, film formation of an upper electrode 109b is performed. The upper electrode 109b is formed in a manner similar to that of the lower electrode 109a.

Figure 10L:
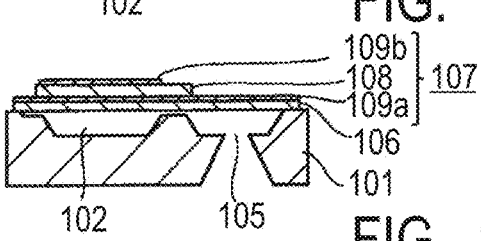

Then, as shown in FIG. 10L, the upper electrode 109b, the piezoelectric layer 108, and the lower electrode 109a are processed successively by photolithography and etching to form a piezoelectric element 107. The piezoelectric element 107 is provided on the vibration plate 106 at a position corresponding to each pressure generating chamber 102. Etching of the upper electrode 109b and the lower electrode 109a is achieved by dry etching using an Ar gas with a photoresist as a mask. The etching of the piezoelectric layer 108 is achieved by wet etching with an etchant obtained by mixing an aqueous hydrofluoric acid solution and an aqueous nitric acid solution as needed, with a photoresist as a mask.

Figure 10M:
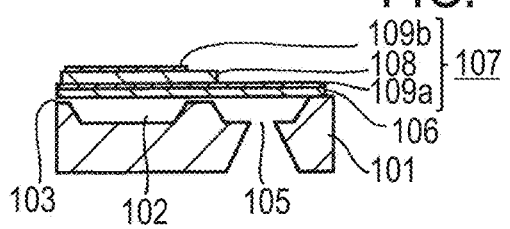

Then, as shown in FIG. 10M, the vibration plate 106 and the channel substrate 101 are cut at the midpoint of the nozzle 103 to open the nozzle 103 and a liquid ejection head is manufactured. A dicing saw is used for cutting. In the present step, full cutting at a cutting rate of 0.5 mm/sec is performed using a 0.2-mm thick resin-bond diamond blade having a size of #1500 as a cutting blade.

EXAMPLES

Comparative Example 1

In Comparative Example 1, a 2-μm thick PZT film was formed by the conventional method. A base substrate used was obtained by forming a 1-μm thick $SiO_2$ layer on a silicon wafer by thermal oxidation and then forming a 10-nm thick Ti layer and a 150-nm thick Pt layer in order of mention by sputtering.

First, a film-formation initial layer of the PZT film was formed by applying a coating solution for the formation of a PT (lead titanate) layer on the base substrate by spin coating. "Hautoform MS-PT" (trade name), product of Fuji Kagaku Corp was used as the coating solution and the rotational speed of the substrate was set at 2000 rpm. Then, a thinner ("OK73 Thinner", trade name; product of Tokyo Ohka Kogyo) was supplied to a position of 2 mm inside from the peripheral end of the substrate in the substrate radius direction at a substrate rotational speed of 1000 rpm to carry out coat removal (EBR) from the peripheral edge portion of the substrate. Then, temporary drying treatment was performed at 150° C. for 5 minutes.

Then, a PZT film was formed on the substrate having thereon the PT-layer formation coating film by carrying out a cycle comprised of Steps S1 to S4 shown in FIG. 1 eight times in total. "Hautoform MS-PZT" (trade name), product of Fuji Kagaku Corp. was used as a coating solution and the rotational speed of the substrate was set at 3000 rpm. In each cycle, after application (Step S1) of the PZT layer formation coating solution, the above-described thinner was supplied to a position 2 mm inside from the peripheral end of the substrate in the substrate radius direction at a substrate rotational speed of 1000 rpm to carry out coat removal (EBR) at the peripheral edge portion of the substrate (Step S2).

Then, temporary drying treatment was performed at 270° C. for 5 minutes (Step S3). Then, as sintering treatment, RTA (rapid thermal anneal) treatment was performed at 650° C. for 2 minutes in an oxygen atmosphere (Step S4).

Figure 3:
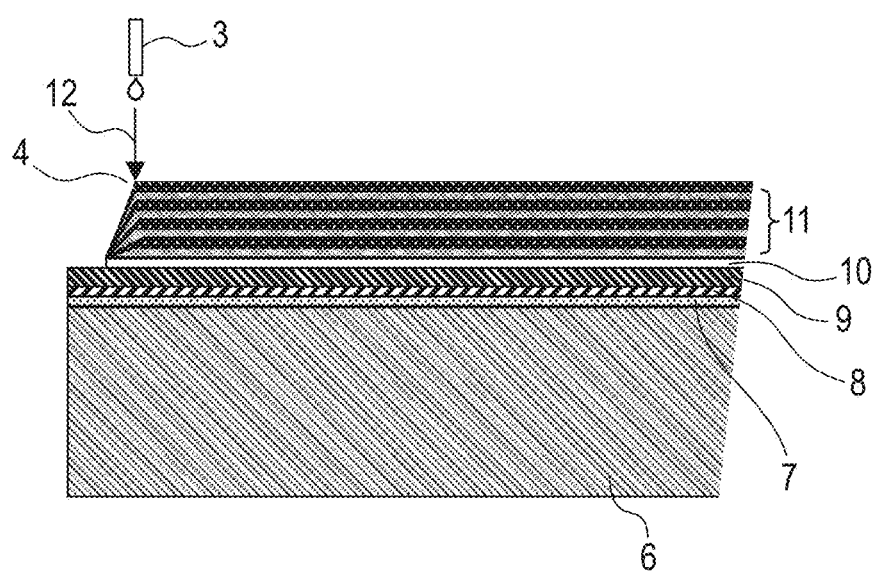
FIG. 3 is a partial cross-sectional schematic view of a substrate having thereon a PZT (lead zirconate titanate) film formed in Comparative Example 1.

FIG. 3 is a partially cross-sectional schematic view of the substrate having thereon the PZT film (eight layers, film thickness: 2 μm) formed in Comparative Example 1. As shown in FIG. 3, a $SiO_2$ layer 7, a Ti layer 8, a Pt layer 9, a PT layer 10 and a PZT film 11 were formed on the silicon wafer 6 in order of mention. In the present example, the position of supplying the coating film with a coat removal liquid from the coat removal liquid ejection orifice 3, that is, the coat removal liquid supply position 12 was always fixed at the same position in the coat removal step performed 8 times in total.

Figure 4:
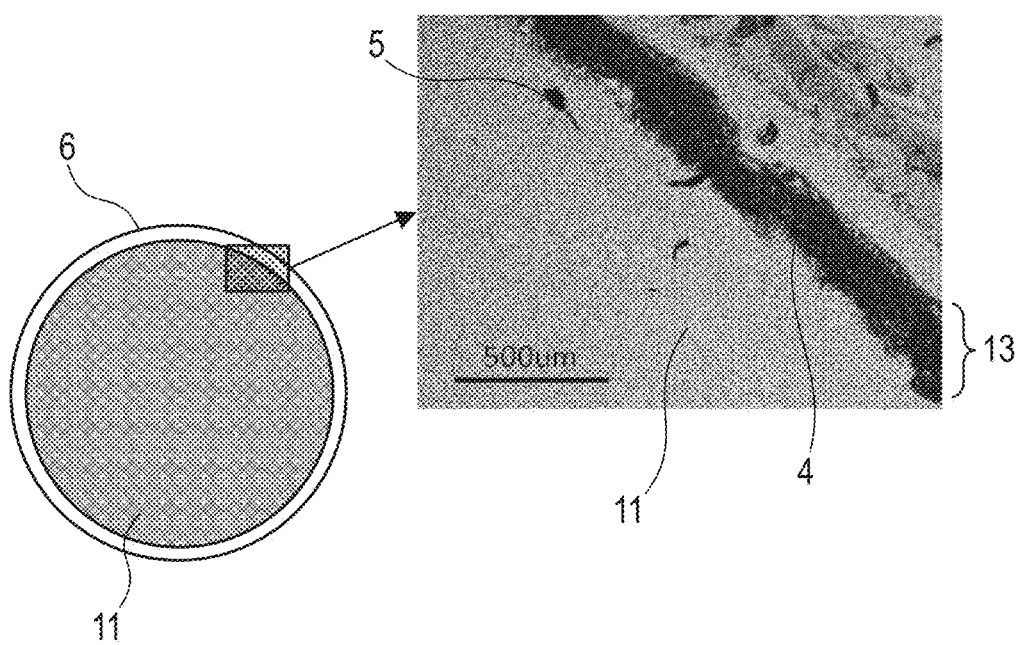
FIG. 4 is a schematic view and an optical microphotograph of the surface of the substrate having thereon the PZT film formed in Comparative Example 1.

FIG. 4 includes a schematic view and an optical micrograph (a portion in the vicinity of the film end portion) of the surface of the substrate having thereon the PZT film formed as described above. In the present example, many cracks were present in the vicinity of the corner portion (corner portion formed between the surface of the film and the end surface of the film) 4 of the PZT film over the entire periphery of the substrate. Many cracks 13 are present in the dark portion of the micrograph. In addition, foreign matters 5 are found on the surface of the PZT film, which may scatter from the cracks. Thus, when the 2-μm thick PZT film is formed by the conventional method, many cracks are inevitably formed in the vicinity of the film end portion. These cracks may cause film exfoliation or become a source of particles, leading to deterioration in production yield.

Referential Example 1

In a manner similar to that of Comparative Example 1 except that the number of the cycles was reduced from 8 to 2, a 500-nm thick PZT (lead zirconate titanate) film was formed.

Figure 5:
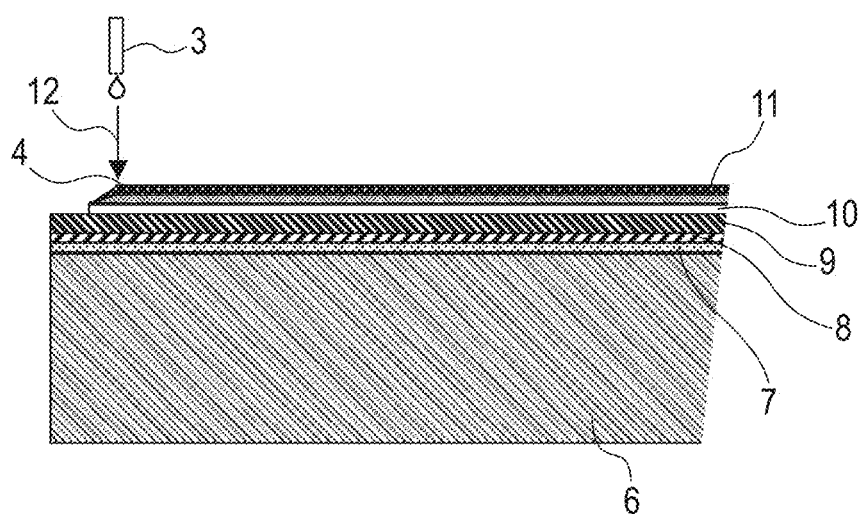
FIG. 5 is a partial cross-sectional schematic view of a substrate having thereon a PZT film formed in Referential Example 1.

FIG. 5 is a partial cross-sectional schematic view of a substrate having a PZT film (two layers, film thickness: 500 nm) formed thereon in the present example. As in Comparative Example 1, the coat removal liquid supply position 12 was always fixed at the same position in the coat removal step performed twice in total.

Figure 6:
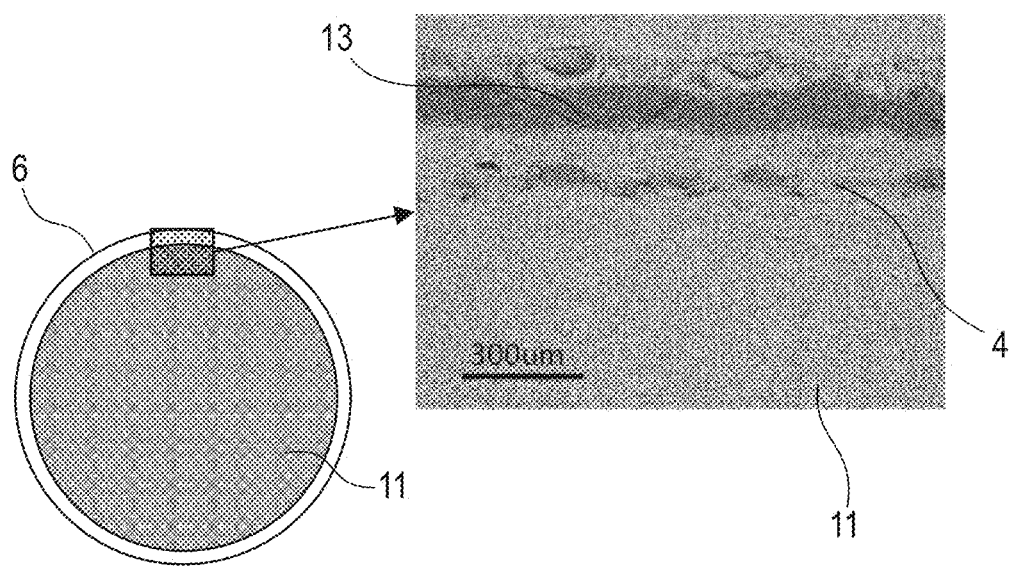
FIG. 6 is a schematic view and an optical microphotograph of the surface of the substrate having thereon the PZT film formed in Referential Example 1.

FIG. 6 includes a schematic view and an optical micrograph (a portion in the vicinity of the film end portion) of the surface of the substrate having the PZT film thereon. They clearly show that although a crack 13 is found at only one site at the corner portion 4 of the PZT film in the present example, a crack occurrence ratio is markedly lower than that of Comparative Example 1.

[Film Thickness Measurement Test]

As described above, cracks are generated due to a film shrinkage stress caused during the sintering treatment (crystallization). The present inventors therefore studied a change in film thickness between before and after the sintering treatment of the PZT film.

A film thickness measurement sample was formed in a manner similar to that of Comparative Example 1 except that the above-described cycle was performed once. The thickness of the PZT film was measured before and after the sintering step S4. The film thickness was measured using an optical interference type film thickness measuring machine (Lambda Ace"VM-2200", trade name) product of Screen Semiconductor Solutions Co. Measurement results are shown in Table 1. Table 1 has revealed that the film thickness is 430 nm before the sintering treatment but after the sintering treatment, it shrinks largely in the film thickness direction and becomes 250 nm. Although a film shrinkage stress that has occurred during the sintering treatment (crystallization) cannot be measured, an about 40% decrease in film thickness obviously shows occurrence of a very large stress.

TABLE 1

|  | Film thickness (nm) |
| --- | --- |
| Before sintering treatment | 430 |
| After sintering treatment | 250 |

[Film Shrinkage Stress in Comparative Example 1 and Referential Example 1]

Figure 7A:
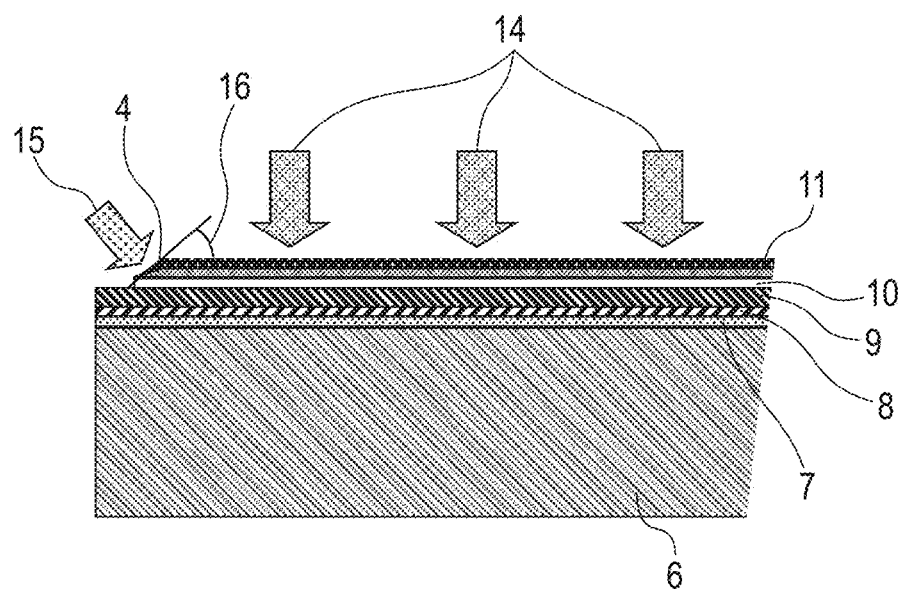

Next, a film shrinkage stress applied to a PZT film will be described referring to FIGS. 7A and 7B. FIG. 7A is a partial cross-sectional schematic view showing application of a film shrinkage stress on the PZT film (two layers, film thickness: 500 nm) formed in Referential Example 1. As shown in FIG. 7A, a film shrinkage stress 14 is applied to the surface of the PZT film during sintering treatment (Step S4). As a result of the coat removal step S2, the end surface of the PZT film is tapered with an angle 16 from the surface of the substrate. When as in FIG. 7A, the PZT film is comprised of a small number of layers, meaning that it is thin, the angle 16 from the surface of the substrate is relatively small. During the sintering treatment, therefore, a film shrinkage stress 15 is applied to the end surface of the PZT film mainly in the film thickness direction. Stress concentration therefore does not occur at the corner portion 4 of the PZT film.

Figure 7B:
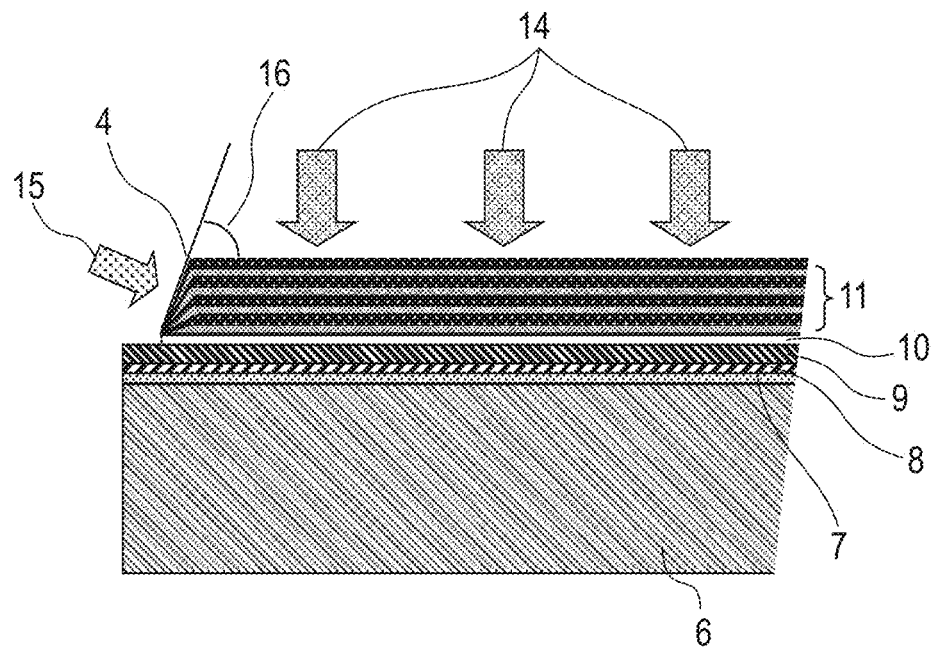

On the other hand, the PZT film (eight layers, film thickness: 2 μm) formed in Comparative Example 1 as shown in FIG. 7B is comprised of a large number of layers and is thick. At the same time, the coat removal liquid supply position 12 is always the same in all the cycles. The angle 16 between the end surface of the PZT film and the surface of the substrate formed by the coat removal step S2 becomes larger than that in Referential Example 1. As a result, the film shrinkage stress 15 is applied to the end surface of the PZT film at the time of the sintering treatment mainly in a direction orthogonal to the surface of the substrate. This causes stress concentration to the corner portion 4 of the PZT film so that the corner portion 4 inevitably has many cracks in the vicinity thereof.

The present inventors have found that cracks at the end portion of the film can be suppressed by keeping the angle between the end surface of the film and the surface of the substrate small even if a ferroelectric film formed by the sol-gel method with spin coating becomes as thick as several μm or more.

Example 1

In the present example, a PZT film (eight layers, film thickness: 2 μm) was formed in a manner similar to that of Comparative Example 1. In the present example, however, the position of the coat removal liquid ejection orifice 3 was moved inward by 0.5 mm in the radius direction of the substrate every two cycles (refer to FIG. 8). Described specifically, in the present example, when a cycle similar to that (S1 to S4) of Comparative Example 1 is repeated eight times, the coat removal liquid ejection orifice 3 is placed at the following position in the coat removal step S2 of each cycle (refer to FIG. 8).

First and second cycles: the coat removal liquid ejection orifice is placed at 17a.

Third and fourth cycles: the coat removal liquid ejection orifice is placed at 17b.

Fifth and sixth cycles: the coat removal liquid ejection orifice is placed at 17c.

Seventh and eighth cycles: the coat removal liquid ejection orifice is placed at 17d.

The distance between the respective positions of any two coat removal liquid ejection orifices (in particular, the respective positions of the center lines of any two coat removal liquid ejection orifices) adjacent to each other, that is, a shift width was 0.5 mm.

The coat removal liquid supply positions at respective cycles therefore have the following relationship. The coat removal liquid supply position is the same between the first cycle and the second cycle. The coat removal liquid supply position is the same between the third cycle and the fourth cycle. The coat removal liquid supply position is the same between the fifth cycle and the sixth cycle. The coat removal liquid supply position is the same between the seventh cycle and the eighth cycle. The coat removal liquid supply position at the third cycle is shifted from that at the second cycle. The coat removal liquid supply position at the fifth cycle is shifted from that at the fourth cycle. The coat removal liquid supply position at the seventh cycle is shifted from that at the sixth cycle. They are all shifted in a direction approaching the center of the substrate with a shift with of 0.5 mm.

Figure 8:
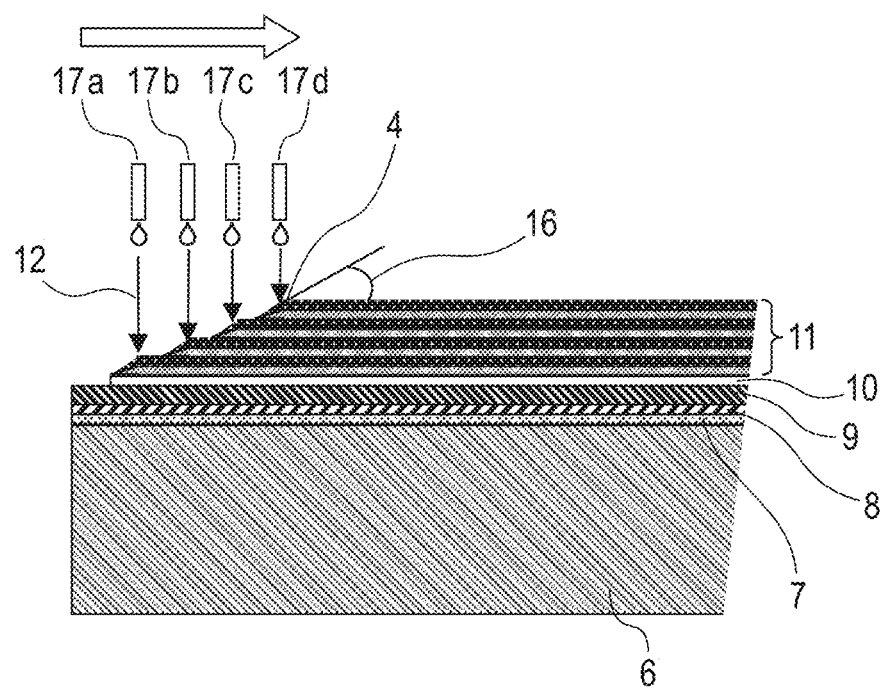
FIG. 8 is a partial cross-sectional schematic view of a substrate having thereon a PZT film formed in Example 1.

In FIG. 8, the coat removal liquid supply position 12 is that at the first cycle and this position is the same as the coat removal liquid supply position in Comparative Example 1.

In the present example, as shown in FIG. 8, even if the above-described cycle is repeated and the PZT film thus obtained is as thick as 2 μm, the angle 16 between the end surface of the PZT film and the surface of the substrate can be kept as small as that of Comparative Example 2. As a result, the film shrinkage stress 15 is applied to the end surface of the PZT film during the sintering treatment mainly in the film thickness direction so that stress concentration does not occur at the end portion (particularly, the corner portion 4) of the PZT film. This makes it possible to suppress formation of cracks at the end portion of the PZT film.

Example 2

In the present example, a film was formed in a manner similar to that of Example 1. In the present example, however, the positions 17a to 17d of the coat removal liquid ejection orifice were arranged in a direction contrary to that of Example 1. More specifically, the position of the coat removal liquid ejection orifice 3 was moved outward by 0.5 mm in the radius direction of the substrate every two cycles (refer to FIG. 9).

Therefore, the coat removal liquid supply positions at respective cycles have a relationship similar to that described in Example 1, but the positions are all shifted in a direction away from the center of the substrate (with a shift with of 0.5 mm).

Figure 9:
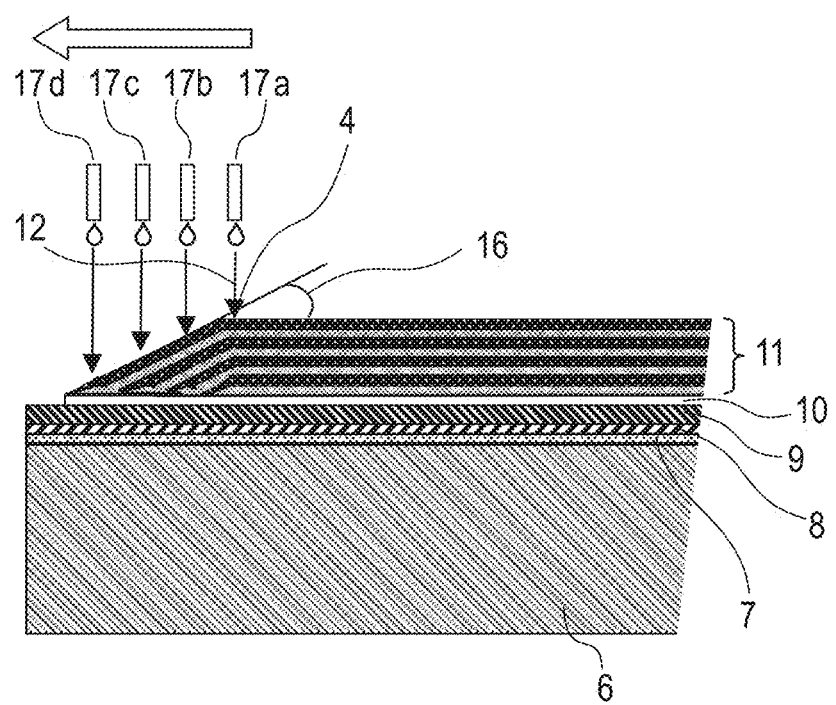
FIG. 9 is a partial cross-sectional schematic view of a substrate having thereon a PZT film formed in Example 2.

In FIG. 9, the coat removal liquid supply position 12 means a coat removal liquid supply position at the last cycle and this position is similar to the coat removal liquid supply position in Comparative Example 1

Also in the present example as in Example 1, even if the PZT film becomes as thick as 2 μm after repetition of the above-described cycle, the angle 16 between the end surface of the PZT film and the surface of the substrate can be kept as small as that of Comparative Example 2. As a result, as in Example 1, occurrence of cracks at the end portion of the PZT film can be suppressed.

The invention is not limited by the above-described Examples. Without departing from the gist of the invention, the application and sintering treatment conditions, the number of application and sintering treatment cycles and the position of the coat removal liquid ejection orifice at each cycle may be changed as needed.

According to one aspect of the invention, there is provided a film production method suited for the production of a piezoelectric film having a thickness of several µm or more and capable of suppressing occurrence of cracks in the vicinity of the end portion of the film.

According to the other aspect of the invention, there is provided a method of producing a liquid ejection head equipped with a piezoelectric material film in a high yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-240794, filed Dec. 15, 2017, which is hereby incorporated by reference herein in its entirety.

What is claimed is:

1. A method of producing a film, comprising repeating N times a cycle comprising:
   a step of applying a coating solution onto a substrate to form a coat film;
   a step of removing the coating film in a region on a peripheral edge portion of the substrate by supplying the coating film with a liquid while rotating the substrate; and
   a step of carrying out a sintering treatment to above a crystallization temperature of the coating film to crystallize a portion of the coating film that has remained after the removing of the coating film from the region,
   wherein N represents an integer of 2 or more,
   wherein, in each cycle, the step of applying the coating solution, the step of removing the coating film, and the step of carrying out sintering treatment are carried out once in stated order, and
   wherein when n represents an integer of 1 to N−1:
   relative to a supply position of the liquid to the coating film in the step of removing the coating film in the n cycle, a supply position of the liquid to the coating film in the step of removing the coating film in the n+1 cycle is the same or shifted in a direction toward a center of the substrate for all the n and, at the same time, shifted in the direction toward the center of the substrate for at least one of the n; or
   relative to the supply position of the liquid to the coating film in the step of removing the coating film in the n cycle, the supply position of the liquid to the coating film in the step of removing the coating film in the n+1 cycle is the same or shifted in a direction away from the center of the substrate for all the n and, at the same time, shifted in the direction away from the center of the substrate for at least one of the n,
   provided that when N=2, relative to the supply position of the liquid to the coating film in the step of removing the coating film in the n, the supply position of the liquid to the coating film in the step of removing the coating film in the n+1 is shifted in the direction toward or away from the center of the substrate.

2. The method according to claim 1, wherein the coating solution contains an organic metal compound.

3. The method according to claim 2, wherein the organic metal compound contains two or more elements selected from the group consisting of lead, titanium zirconium, barium, calcium, niobium, tantalum, bismuth, potassium, iron, manganese, ruthenium, and strontium.

4. The method according to claim 2, wherein the liquid contains a component of the organic metal compound.

5. The method according to claim 2, wherein the film is a piezoelectric material having a perovskite structure.

6. A method of producing a liquid ejection head equipped with a piezoelectric film, the method comprising producing the piezoelectric film,
   wherein the producing of the piezoelectric film comprises repeating N times a cycle comprising:
   a step of applying a coating solution onto a substrate to form a coat film;
   a step of removing the coating film in a region on a peripheral edge portion of the substrate by supplying the coating film with a liquid while rotating the substrate; and
   a step of carrying out a sintering treatment to above a crystallization temperature of the coating film to crystallize a portion of the coating film that has remained after the removing of the coating film from the region,
   wherein N represents an integer of 2 or more,
   wherein, in each cycle, the step of applying the coating solution, the step of removing the coating film, and the step of carrying out sintering treatment are carried out once in stated order, and
   wherein when n represents an integer of 1 to N−1:
   relative to a supply position of the liquid to the coating film in the step of removing the coating film in the n cycle, a supply position of the liquid to the coating film in the step of removing the coating film in the n+1 cycle is the same or shifted in a direction toward a center of the substrate for all the n and, at the same time, shifted in the direction toward the center of the substrate for at least one of the n; or
   relative to the supply position of the liquid to the coating film in the step of removing the coating film in the n cycle, the supply position of the liquid to the coating film in the step of removing the coating film in the n+1 cycle is the same or shifted in a direction away from the center of the substrate for all the n and, at the same time, shifted in the direction away from the center of the substrate for at least one of the n,
   provided that when N=2, relative to the supply position of the liquid to the coating film in the step of removing the coating film in the n cycle, the supply position of the liquid to the coating film in the step of removing the coating film in the n+1 cycle is shifted in the direction toward or away from the center of the substrate.

* * * * *